(12) United States Patent
Iwasaki et al.

(10) Patent No.: US 9,606,460 B2
(45) Date of Patent: Mar. 28, 2017

(54) LITHOGRAPHY APPARATUS, AND METHOD OF MANUFACTURING ARTICLE

(71) Applicant: CANON KABUSHIKI KAISHA, Tokyo (JP)

(72) Inventors: Yuichi Iwasaki, Utsunomiya (JP); Satoru Oishi, Utsunomiya (JP); Hideki Ina, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/940,349

(22) Filed: Nov. 13, 2015

(65) Prior Publication Data
US 2016/0139510 A1 May 19, 2016

(30) Foreign Application Priority Data

Nov. 18, 2014 (JP) .................................. 2014-234002

(51) Int. Cl.
*G21K 5/04* (2006.01)
*G03F 9/00* (2006.01)

(52) U.S. Cl.
CPC ..................... *G03F 9/70* (2013.01)

(58) Field of Classification Search
USPC ............. 250/306, 307, 309, 310, 311, 491.1, 250/492.1, 492.21, 492.22, 492.23, 492.3
See application file for complete search history.

(56) References Cited

U.S. PATENT DOCUMENTS

| | | | |
|---|---|---|---|
| 7,897,942 B1 | 3/2011 | Bareket et al. | |
| 2003/0176987 A1* | 9/2003 | Nakajima | G03F 9/70 702/159 |

(Continued)

FOREIGN PATENT DOCUMENTS

| | | |
|---|---|---|
| JP | 2000228351 A | 8/2000 |
| JP | 2007115758 A | 5/2007 |

OTHER PUBLICATIONS

Gubiotti, et al., "Reflective Electron Beam Lithography: Lithography Results Using CMOS Controlled Digital Pattern Generator Chip", Proc. SPIE 8680, Mar. 26, 2013, Alternative Lithographic Technologies V, 86800H1-86800H-11; doi:10.1117/12.2010722.

(Continued)

*Primary Examiner* — Nicole Ippolito
(74) *Attorney, Agent, or Firm* — Rossi, Kimms & McDowell LLP

(57) ABSTRACT

The present invention provides a lithography apparatus including a plurality of detectors each configured to detect a mark on the substrate, and a controller configured to control a patterning so that a first operation and a second operation are alternately performed, the first operation irradiating the substrate with a beam while scan movement of the substrate is performed in a first direction, the second operation performing step movement of the substrate in a second direction different from the first direction, wherein the controller is configured to cause, in the first operation, at least one of the plurality of detectors to detect the mark, and the plurality of detectors are arranged, in the second direction, at an interval which is a positive integer multiple of a distance of the step movement.

15 Claims, 10 Drawing Sheets

(56) References Cited

U.S. PATENT DOCUMENTS

| | | | | |
|---|---|---|---|---|
| 2005/0214958 A1* | 9/2005 | Nakasuji | ............ | G01N 23/225 |
| | | | | 438/14 |
| 2006/0250597 A1* | 11/2006 | Nakajima | ............ | G03F 9/7049 |
| | | | | 355/55 |
| 2007/0057204 A1* | 3/2007 | Kruit | ............ | B82Y 10/00 |
| | | | | 250/492.23 |
| 2009/0220872 A1* | 9/2009 | Oishi | ............ | G03F 9/7092 |
| | | | | 430/30 |
| 2013/0313744 A1* | 11/2013 | Maruyama | ............ | G03F 7/0002 |
| | | | | 264/40.1 |

OTHER PUBLICATIONS

Petric, et al., "REBL Nanowriter: Reflective Electron Beam Lithography", Proc. SPIE 7271, Mar. 18, 2009, Alternative Lithographic Technologies, 727107-1-707107-15; doi: 10.1117/12.817319.

* cited by examiner

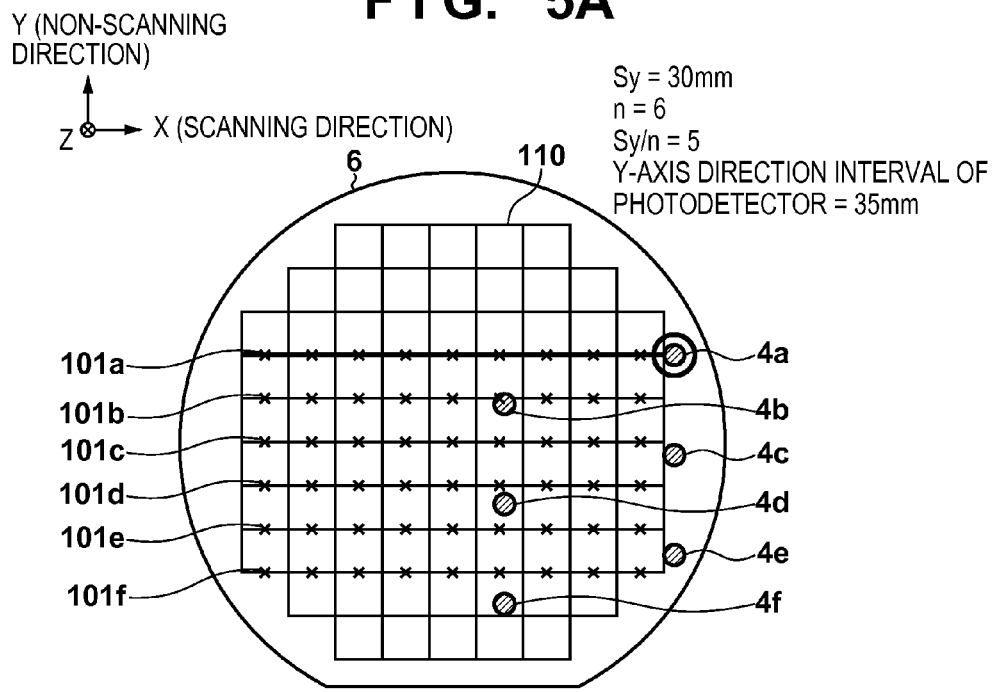
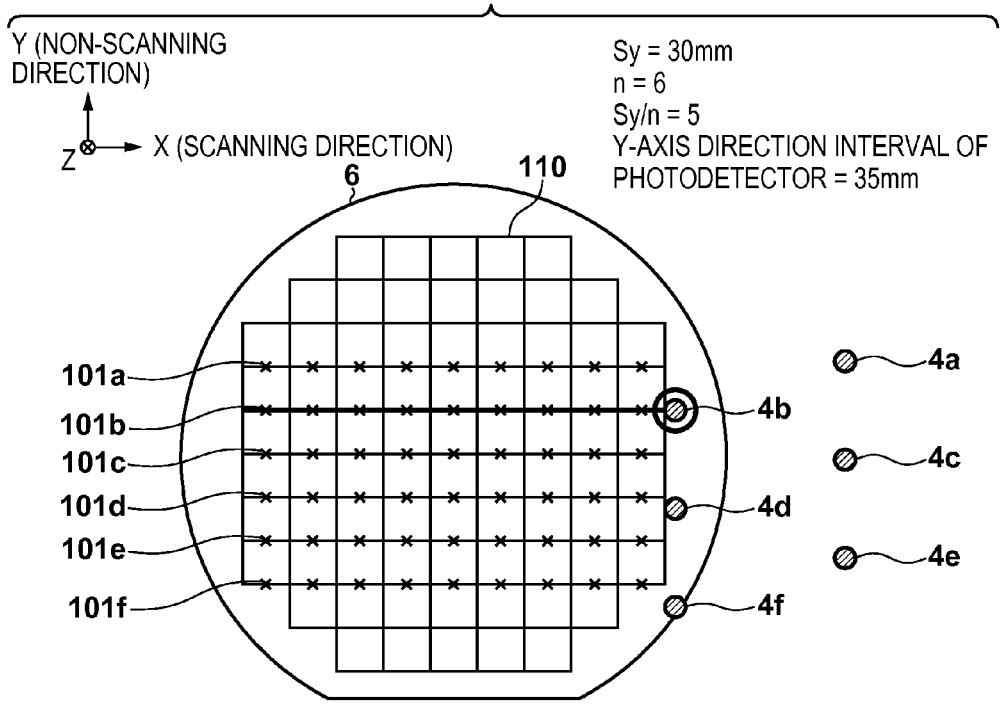

LITHOGRAPHY APPARATUS, AND METHOD OF MANUFACTURING ARTICLE

BACKGROUND OF THE INVENTION

Field of the Invention

The present invention relates to a lithography apparatus, and a method of manufacturing an article.

Description of the Related Art

Resolution, throughput, and overlay precision are three indices which are considered to be important in a lithography technique. Resolution indicates the minimum size of a pattern which can be formed on a substrate, and throughput indicates the number (productivity) of substrates that can be processed per unit time. Overlay precision indicates the precision of overlaying (aligning) a pattern to be drawn (exposed) on a pattern formed on the substrate by preceding semiconductor process steps (layer).

In a drawing apparatus that performs drawing on a substrate with a charged particle beam, there are various factors that decrease the overlay precision regarding a stage, a magnetic field, charge, heat, a charged particle beam, a measurement system, an optical system, or the like. Among these, factors other than charge or heat are mainly considered to be systematic factors, and the overlay precision can be compensated by correcting through normal alignment. In correction by normal alignment, first, a plurality of alignment marks formed on the substrate are detected, and based on the detected values, an array of all the shot regions (or some of the shot regions) drawn on the substrate is obtained. Then, based on the array of shot regions obtained in this manner, the overlay precision is compensated by correcting the position (irradiation position) of the charged particle beam on the substrate in the initial data.

On the other hand, remaining factors such as charge or heat are factors which are generated when the substrate is irradiated with the charged particle beam after normal alignment. More specifically, charge is generated on the surface of the substrate when the substrate is irradiated with the charged particle beam, and an electronic field resulting from this acts on the charged particle beam. This causes the charged particle beam to irradiate a position shifted from the position to be irradiated with the charged particle beam, and thus the overlay precision is decreased. The overlay precision also decreases when the substrate is heated and deformed by irradiation on the substrate with the charged particle beam and the charged particle beam irradiates a position shifted from the position to be irradiated with the charged particle beam.

As a technique to solve the decrease in overlay precision due to charge, a technique for setting a conductive film on the surface of a substrate has been proposed. However, in practice, the positional shift of the charged particle beam cannot be completely solved even when a conductive film is used.

Heat-induced deformation (deformation amount and direction) of the substrate is associated with parameters such as the condition concerning the charged particle beam, the density and distribution of the pattern to be drawn on the substrate, the layer structure of the substrate, and the friction of the chuck holding the substrate, and thus it is extremely difficult to predict the deformation amount and direction. Also, since heat-induced deformation of the substrate occurs during the drawing operation on the substrate, measurement and correction must be performed during the operation. Techniques for solving the decrease in overlay precision due to heat have been proposed in U.S. Pat. No. 7,897,942, Japanese Patent Laid-Open No. 2007-115758, Japanese Patent Laid-Open No. 2000-228351, "Proc. of SPIE Vol. 8680 86800H-1", and "Proc. of SPIE Vol. 7271 727107-13".

U.S. Pat. No. 7,897,942 proposes a technique for obtaining the distortion of the substrate by measuring a plurality of mark positions on the substrate with a mark measurement system and performing fitting after calculating the distance between the marks. U.S. Pat. No. 7,897,942 discloses that decrease in overlay precision due to substrate distortion can be suppressed by correcting the relative positional shifts between the charged particle beam and the substrate. The arrangement of eight mark measurement systems is also proposed in U.S. Pat. No. 7,897,942.

Japanese Patent Laid-Open No. 2007-115758 proposes a technique for correcting the relative positional shifts between an exposure light and a substrate, due to temporal change in the substrate, by using a measurement system used for normal alignment. In Japanese Patent Laid-Open No. 2007-115758, while a given shot region is exposed, the position of a mark formed on the next shot region is measured, and the result of this measurement is reflected upon exposing the next shot region. It discloses that the relative positional shifts between the exposure light and the substrate due to temporal change in the substrate can be corrected as a result of the above operation.

Japanese Patent Laid-Open No. 2000-228351 proposes a technique for correcting the relative positions of a charged particle beam and a substrate by measuring the positions of the marks by using the charged particle beam. Japanese Patent Laid-Open No. 2000-228351 discloses that the relative positional shifts between the charged particle beam and the substrate caused by the distortion of the substrate can be corrected.

"Proc. of SPIE Vol. 8680 86800H-1" proposes a mass production drawing apparatus that is provided with thirty-six charged particle optical systems (columns). Furthermore, "Proc. of SPIE Vol. 7271 727107-13" proposes a technique for simultaneously measuring the marks on the substrate by a plurality of measurement systems during drawing (scanning) of the substrate.

Although the related-art literatures cited above as conventional techniques propose to correct the relative positional shifts between a charged particle beam and a substrate by measuring the distortion (deformation) of the substrate, neither a specific arrangement of the measurement nor a specific procedure (sequence) for the correction is disclosed.

SUMMARY OF THE INVENTION

The present invention provides, for example, a lithography apparatus advantageous in overlay precision obtained thereby.

According to one aspect of the present invention, there is provided a lithography apparatus that performs patterning on a substrate with a beam, the apparatus including an optical system configured to irradiate the substrate with the beam, a plurality of detectors each configured to detect a mark on the substrate, and a controller configured to control the patterning so that a first operation and a second operation are alternately performed, the first operation irradiating the substrate with the beam by the optical system while scan movement of the substrate is performed in a first direction, the second operation performing step movement of the substrate in a second direction different from the first direction, wherein the controller is configured to cause, in the first operation, at least one of the plurality of detectors to detect the mark, and the plurality of detectors are arranged, in the second direction, at an interval which is a positive integer multiple of a distance of the step movement.

Further aspects of the present invention will become apparent from the following description of exemplary embodiments with reference to the attached drawings.

BRIEF DESCRIPTION OF THE DRAWINGS

FIG. 5A is a view for explaining the drawing process of the drawing apparatus shown in FIG. 1.

FIG. 5B is a view for explaining the drawing process of the drawing apparatus shown in FIG. 1.

DESCRIPTION OF THE EMBODIMENTS

Figure 1:
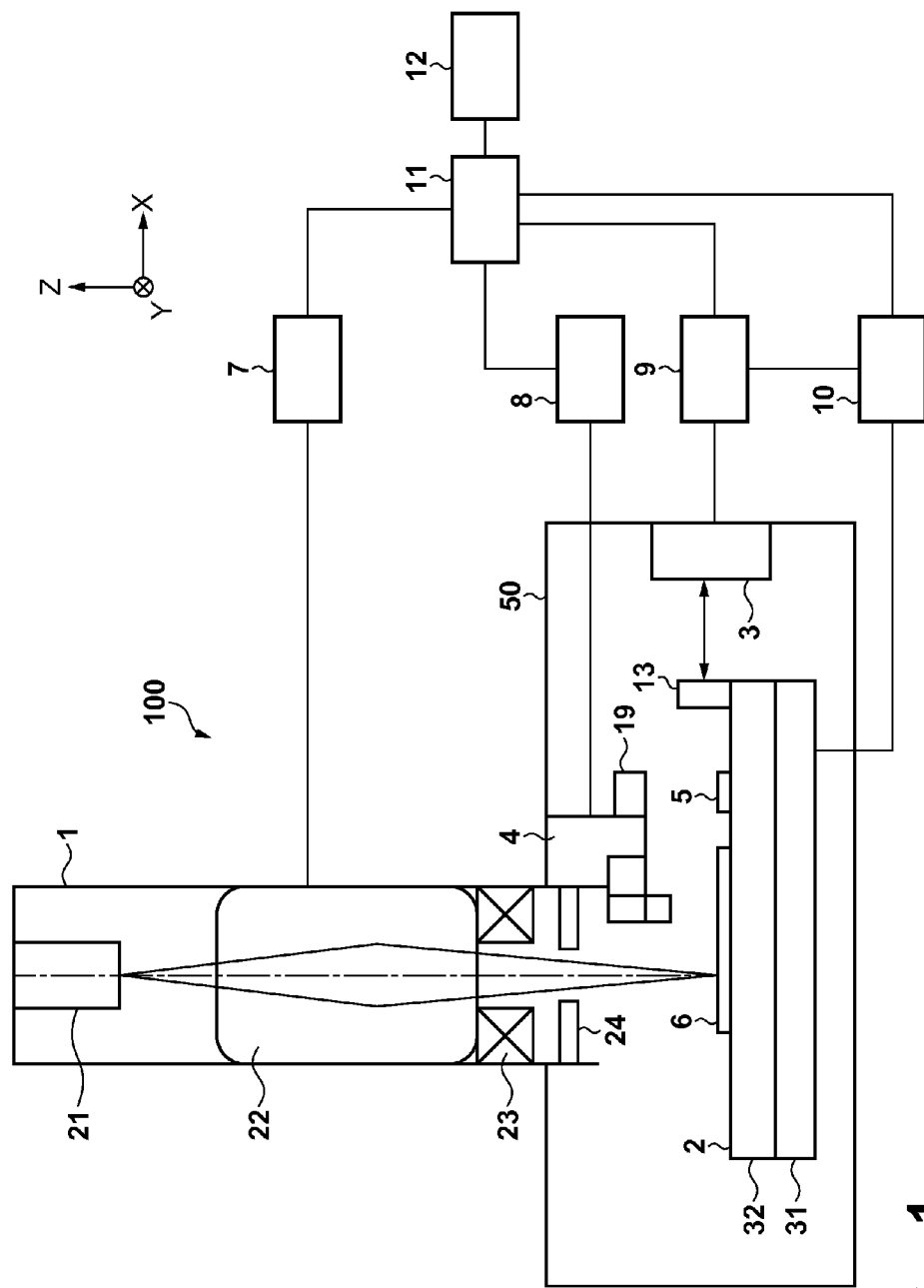
FIG. 1 is a schematic view showing the arrangement of a drawing apparatus as one aspect of the present invention.

Preferred embodiments of the present invention will be described below with reference to the accompanying drawings. Note that the same reference numerals denote the same members throughout the drawings, and a repetitive description thereof will not be given.

FIG. 1 is a schematic view showing the arrangement of a drawing apparatus 100 as one aspect of the present invention. The drawing apparatus 100 is a lithography apparatus that performs patterning on a substrate with a beam and draws on the substrate with the beam. Note that the beam is an electron beam in this embodiment. The beam, however, may be another charged particle beam such as an ion beam or a light beam and is generally considered to be a radiant (energy) beam.

The drawing apparatus 100 includes an electron gun 21, an electron optical system (charged particle optical system) 1, an electron detection unit 24, a stage 2 that can move while holding a substrate 6, an interferometer 3, a photodetector 4, a driving unit 19 for driving the photodetector 4, and a vacuum chamber 50. The drawing apparatus 100 also includes an electron system control unit 7, an optical system control unit 8, a position calculation unit 9, a stage control unit 10, a main control unit 11, and a memory 12.

The vacuum chamber 50 supports the electron optical system 1 and contains the stage 2, the interferometer 3, the photodetector 4, and the like. The vacuum chamber 50 is evacuated by a vacuum pump so as to create a vacuum state inside the chamber.

The electron optical system 1 includes an electron lens system 22 in which the electron beam emitted from the electron gun 21 is converged and a deflector 23 for deflecting the electron beam, and irradiates the substrate 6 with the electron beam. The electron gun 21, the electron optical system 1, and the electron detection unit 24 are controlled by the electron system control unit 7. When drawing a pattern on the substrate 6 by using the electron beam, the electron system control unit 7 scans the electron beam in the Y-axis direction by the deflector 23 and controls irradiation/non-irradiation with the electron beam in accordance with the pattern to be drawn on the substrate 6. When measuring the position of the substrate 6 by using the electron beam, the electron system control unit 7 scans the electron beam on the substrate 6 by the deflector 23 and obtains the position of the substrate 6 by detecting the secondary electrons emitted from the substrate 6 by the electron detection unit 24. Although only one electron optical system 1 is shown in FIG. 1, the drawing apparatus 100 can include a plurality of electron optical systems 1, as will be described later.

The stage 2 includes a Y stage 31 and an X stage 32 and holds the substrate 6 on which a photosensitive agent (resist) has been applied. The stage 2 has an arrangement in which the X stage 32 is arranged on the Y stage 31. In addition, a Z stage for positioning the substrate 6 in a Z-axis direction parallel to the axis of the electron optical system 1 (the electron lens system 22) is arranged on the X stage 32. The interferometer 3 irradiates, with a laser, a mirror 13 fixed on the stage 2 and detects the reflected beam. The position calculation unit 9 calculates the position of the stage 2 based on the detection result of the interferometer 3. The stage control unit 10 controls the stage 2 based on the position of the stage calculated by the position calculation unit 9.

The photodetector 4 detects marks provided on the substrate 6 and a reference mark 5 provided on the stage 2. For example, the photodetector 4 illuminates alignment marks and marks for obtaining the distortion (distortion amount) of the substrate 6 due to heat by using light of a wavelength band which will not sensitize the photosensitive agent applied on the substrate 6 and detects the marks by forming the reflected beam into an image on the detection surface (imaging surface). Note that the distortion amount of the substrate 6 includes, for example, a component related to the magnification of the substrate 6.

The method is not limited to a specific one in the detection of the marks for obtaining the distortion of the substrate 6 as long as a mark arranged on a scribe line (in a scribe region) of each shot region on the substrate 6 can be detected by the photodetector 4 while scanning the substrate 6 in the X-axis direction as the scanning direction. For example, if an image process method is employed, the marks can be detected during scanning of the substrate 6 by using a TDI (Time Delay Integration) sensor. Also, a method of arranging a mark called a chevron mark on the respective scribe lines and focusing a beam such as a laser beam on the substrate to detect the scattered beam may be employed. The optical system control unit 8 obtains the positions of the marks with respect to the optical axis of the photodetector 4 based on the detection result of the photodetector 4. Note that the photodetector 4 can be configured to be driven, by the driving unit 19, in the Y-axis direction which is a non-scanning direction different from the scanning direction. Although only one photodetector 4 is shown in FIG. 1, the drawing apparatus 100 includes a plurality of photodetectors 4 in this embodiment, as will be described later.

The main control unit 11 includes a CPU and controls the overall (operation of) drawing apparatus 100. The main control unit 11 processes respective pieces of information from the electron system control unit 7, the optical system control unit 8, the position calculation unit 9, and the stage control unit 10 and controls each unit of the drawing apparatus 100. The main control unit 11 alternately performs a drawing operation (first operation) and a step operation (second operation) to draw on the entire surface of the substrate 6. The drawing operation is an operation to irradiate the substrate 6 with the electron beam by the electron optical system 1 while performing scan movement of the stage 2 (substrate 6) in the X-axis direction (first direction). The step operation is an operation of performing step movement of the stage 2 in the Y-axis direction (second direction). In addition, in the drawing operation, the main control unit 11 causes the photodetector 4 to detect the marks for obtaining the distortion of the substrate 6 in parallel with the irradiation of the electron beam by the electron optical system 1. The main control unit 11 then corrects, based on the respective pieces of position information of the marks, the irradiation position of the electron beam from the electron optical system 1 depending on the distortion of the substrate 6. The memory 12 stores information necessary for the main control unit 11.

Figure 2:
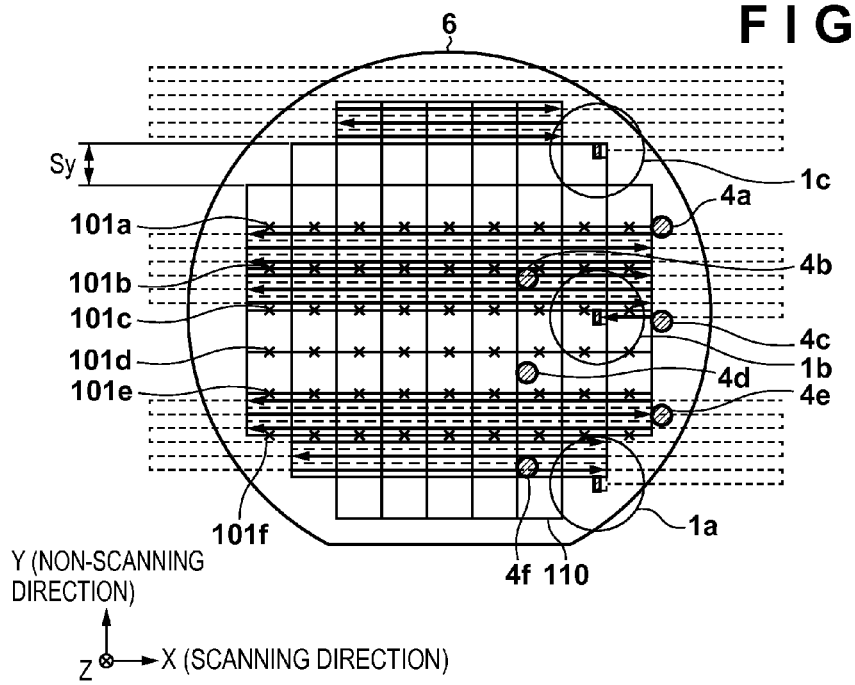
FIG. 2 is a schematic view showing the arrangement relationship between an electron optical system, a photodetector, shot layout, and marks.

A case in which the drawing apparatus 100 includes three electron optical systems 1a, 1b, and 1c and six photodetectors 4a, 4b, 4c, 4d, 4e, and 4f will be described with reference to FIG. 2. FIG. 2 is a schematic view showing the arrangement relationship between the electron optical system 1a to 1c, the photodetectors 4a to 4f, a shot region array (shot layout) 110 of the substrate 6, and marks 101a to 101f for obtaining the distortion of the substrate 6.

In order to draw on the entire surface of the substrate 6 by the three electron optical systems 1a to 1c, the electron optical systems 1a to 1c are arranged at equal intervals in the Y-axis direction. The marks 101a to 101f are arranged on predetermined scribe lines, respectively, along the X-axis direction. Each mark of the marks 101a to 101f includes mark elements arranged at predetermined intervals on the scribe line of each shot region on the substrate 6. For example, each mark of the marks 101a to 101f includes one mark element for each shot region in this embodiment.

The photodetectors 4a to 4f are arranged at an interval that is a positive integer multiple of the step movement distance in the step operation for performing step movement of the stage 2 in the Y-axis direction. In other words, the photodetectors 4a to 4f are arranged at intervals in the Y-axis direction so that the marks 101a to 101f can be detected, in accordance with the movement of the stage 2 in the Y-axis direction by once or a plurality of times of the second operation, by any one of the photodetectors 4a to 4f during the drawing operation. More specifically, the photodetectors 4a to 4f are arranged at intervals in the Y-axis direction so that a Y-coordinate $Y_i$ representing a position in the Y-axis direction for each of the photodetectors 4a to 4f is satisfied by $$Y_i = Y_0 + \{(i-1) + k_i/n\} \times Sy \quad (1)$$

where n=number of photodetectors, i=1 to n, $k_i$=positive integer, Sy=shot region size (width) in the Y-axis direction, and $Y_0$=arbitrary Y-coordinate (that is, Y-coordinate of an arbitrary mark) according to the shot layout.

By arranging the photodetectors 4a to 4f at such intervals, the detection of the marks 101a to 101f by the photodetectors 4a to 4f can be performed substantially at equal time intervals, that is, per every step movement by a predetermined distance in the Y-axis direction as the non-scanning direction. This can be explained by the Vernier principle. The Vernier principle is a principle that uses the overlap of two repetitive patterns having different spatial frequencies and is applied to, for example, the vernier scale of a vernier caliper.

In FIG. 2, for example, if Sy=30 mm, since six photodetectors 4a to 4f (n=6) are to be arranged, the interval between each of the photodetectors 4a to 4f in the Y-axis direction becomes 35 mm from the equation (1). Furthermore, in FIG. 2, the six photodetectors 4a to 4f are arranged at equal intervals in the Y-axis direction.

The shot region size Sy used for manufacturing semiconductor devices tends to be about 33 mm to 27 mm due to productivity and restrictions in the exposure range (33 mm×26 mm max) of current mainstream exposure apparatuses. Accordingly, it is preferable for the six photodetectors 4a to 4f to be drivable within the range of 35 mm±3.5 mm in the Y-axis direction, and the photodetectors 4a to 4f can be driven in the Y-axis direction by the driving unit 19 in this embodiment. However, note that the driving range of each photodetector 4 in the Y-axis direction is appropriately set in accordance with the number of the photodetectors 4.

The respective marks 101a to 101f can be appropriately arranged on the scribe lines of the respective shot regions of the substrate 6. Each mark of the marks 101a to 101f includes at least two mark elements and can include one mark element per one shot region. The distortion of the substrate 6 can be more accurately obtained when each mark of the marks 101a to 101f includes multiple mark elements with respect to one shot region.

In this manner, by arranging the electron optical systems 1a to 1c, the photodetectors 4a to 4f, and the marks 101a to 101f in accordance with the shot layout, the marks 101a to 101f can be detected by the photodetectors 4a to 4f simultaneously with drawing of the pattern.

In general, since the shot size of the substrate 6 is freely determined, when detecting the marks 101a to 101f, it does not necessarily ensure that the center of each mark arranged on the scribe line of each shot region will coincide (overlap) with the detection center of a corresponding photodetector 4. Although coincidence of the center of a mark and the detection center of a photodetector 4 is ideal, an arrangement capable of mark detection even if the center of a mark and the detection center of a photodetector 4 are shifted will be described with reference to FIG. 3.

Figure 3:
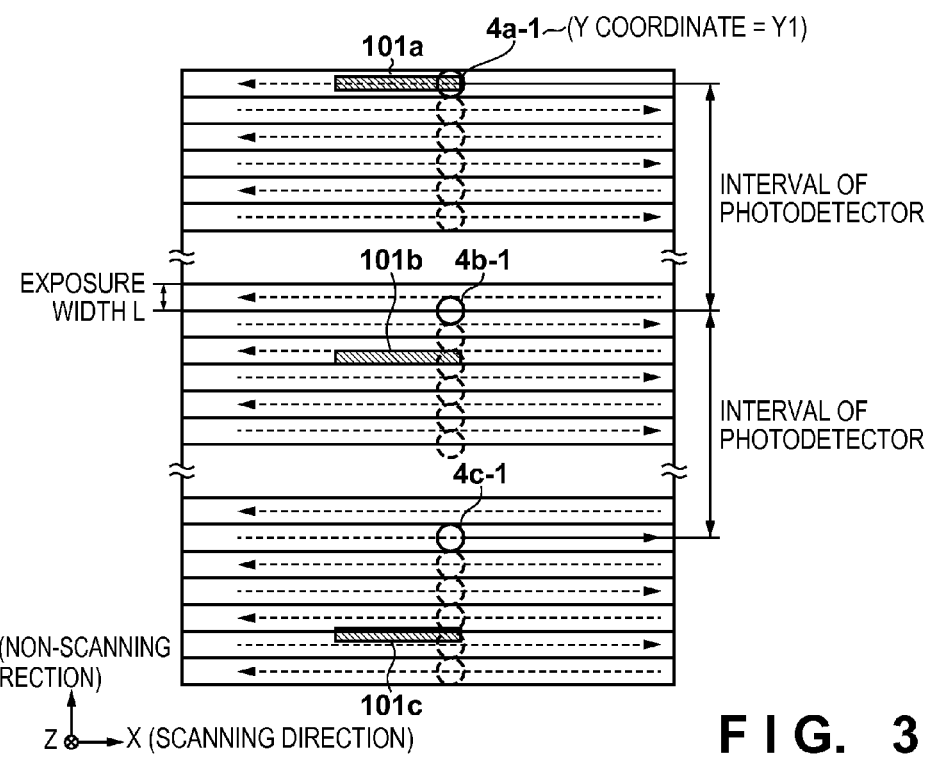
FIG. 3 is a schematic view showing the relationship between the detection field of each photodetector and a corresponding mark.

Three photodetectors 4a to 4c are arranged in FIG. 3. As described above, the drawing apparatus 100 draws on the substrate 6 by alternately performing the drawing operation and the step operation. In FIG. 3, the distance of one step movement in the step operation, that is, the drawing width in one drawing operation, corresponds to an exposure width L. In addition, the photodetectors 4a to 4c are arranged so that the Y-coordinate $Y_i$ of each of the photodetectors 4a to 4c satisfies the equation (1). In this case, if sizes of detection fields 4a-1, 4b-1 and 4c-1 of the photodetectors 4a, 4b, and 4c, respectively, are equal to the exposure width L, the detection fields 4a-1 to 4c-1 will definitely pass a half (50%) or more of the Y-axis direction widths of the mark 101a to mark 101c, respectively. Therefore, the photodetectors 4a to 4c each have a detection field of a size equal to the exposure width L and are configured so that the marks 101*a* to 101*c* are detectable if at least half of the Y-axis direction width of each mark of the marks 101*a* to 101*c* falls within the detection field of the corresponding one of the photodetectors 4*a* to 4*c*. In this manner, even if the center of each mark on a scribe line is shifted from the detection center of a corresponding photodetector, mark detection is possible and all of the marks on the substrate can be detected.

Figure 4:
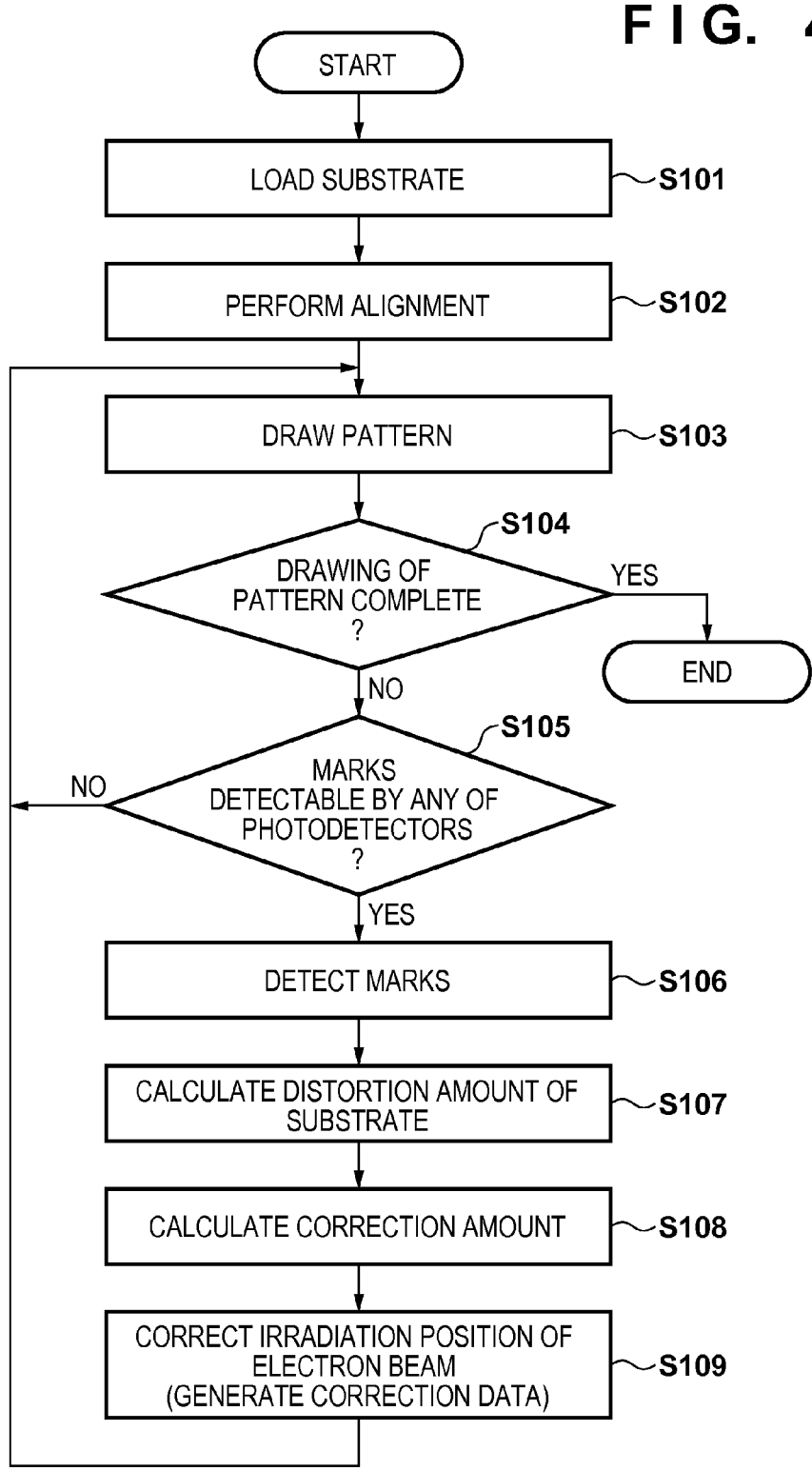
FIG. 4 is a flowchart for explaining the drawing process of the drawing apparatus shown in FIG. 1.

The drawing process in the drawing apparatus 100, that is, the process of drawing a pattern on the substrate 6 by using each electron beam will be described with reference to FIG. 4. The drawing process includes, as described above, the drawing operation and the step operation and is performed by the main control unit 11 integrally controlling each unit of the drawing apparatus 100.

In step S101, the substrate 6 is loaded into the drawing apparatus 100 by a substrate transportation apparatus, and the substrate 6 is held by the stage 2. In step S102, normal alignment is performed. More specifically, alignment marks provided on the substrate 6 are detected by the photodetectors 4*a* to 4*f*, and the shot region array (shot layout) of the substrate 6 is obtained based on the detected values. Then, based on the shot layout, the irradiation position of each electron beam on the substrate is corrected in the drawing data (that is, correction data is generated).

In step S103, a pattern is drawn on the substrate 6 by alternately performing the drawing operation and the step operation based on the correction data obtained in step S102 and the data of the pattern to be drawn on the substrate 6. If step S109 (to be described later) has been performed, the pattern is drawn on the substrate 6 based on the data of the pattern to be drawn on the substrate 6 and the correction data obtained in step S109, instead of the correction data obtained in step S102.

In step S104, it is determined whether the drawing of the pattern on the substrate 6 has been completed. If the drawing of the pattern on the substrate 6 has been completed, the drawing process ends. Otherwise, the process advances to step S105.

In step S105, it is determined, based on the shot layout 110, whether any of the photodetectors 4*a* to 4*f* is positioned on a corresponding scribe line, that is, whether any of the photodetectors 4*a* to 4*f* can detect any of the marks 101*a* to 101*f*. If none of the photodetectors 4*a* to 4*f* can detect any of the marks 101*a* to 101*f*, the process advances to step S103. Otherwise, the process advances to step S106.

In step S106, in parallel with the drawing of the pattern on the substrate 6 (S103), a photodetector, out of the photodetectors 4*a* to 4*f*, that can detect any one of the marks 101*a* to 101*f* detects the mark that can be detected. For example, in FIG. 5A, out of the photodetectors 4*a* to 4*f*, the photodetector 4*a* can detect the mark 101*a*, and thus the photodetector 4*a* detects the mark 101*a*. Since the mark 101*a* includes one mark element per one shot region, each of the nine mark elements is detected by the photodetector 4*a*.

In step S107, the distortion amount of the substrate 6 is calculated based on the position information of any of the marks 101*a* to 101*f* detected in step S106 (that is, the output of at least one of the plurality of photodetectors). For example, in FIG. 5A, the mark 101*a* detected by the photodetector 4*a*, that is, the nine mark elements included in the mark 101*a* are statistically processed, and the distortion amount of the substrate 6 is obtained from the heat-induced positional change of mark 101*a*.

In step S108, the correction amount for correcting the shift in the irradiation position of each electron beam caused by the distortion of the substrate 6 is calculated based on the shot layout obtained in step S102 and the distortion amount of the substrate 6 calculated in step S107.

In step S109, the irradiation position of each electron beam on the substrate in the drawing data is corrected based on the correction amount calculated in step S108. In other words, the correction data for correcting the irradiation position of the electron beam emitted from each electron optical system 1 is generated based on the shot region array of substrate 6 obtained by detecting the alignment marks and the distortion amount calculated in step S107. This correction data is later used to draw a pattern on the substrate 6 (S103).

Figure 5C:
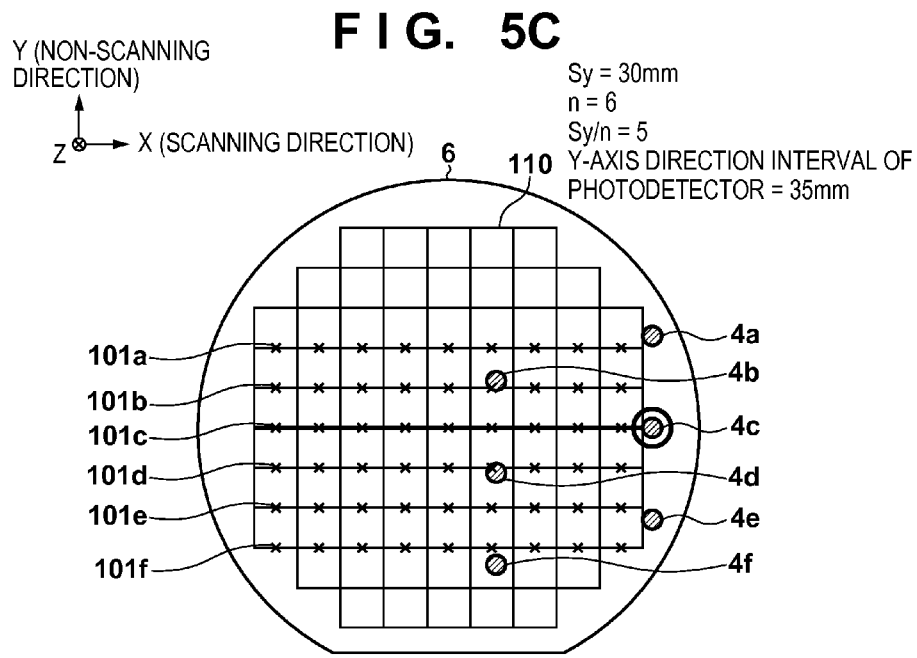
FIG. 5C is a view for explaining the drawing process of the drawing apparatus shown in FIG. 1.
Figure 5D:
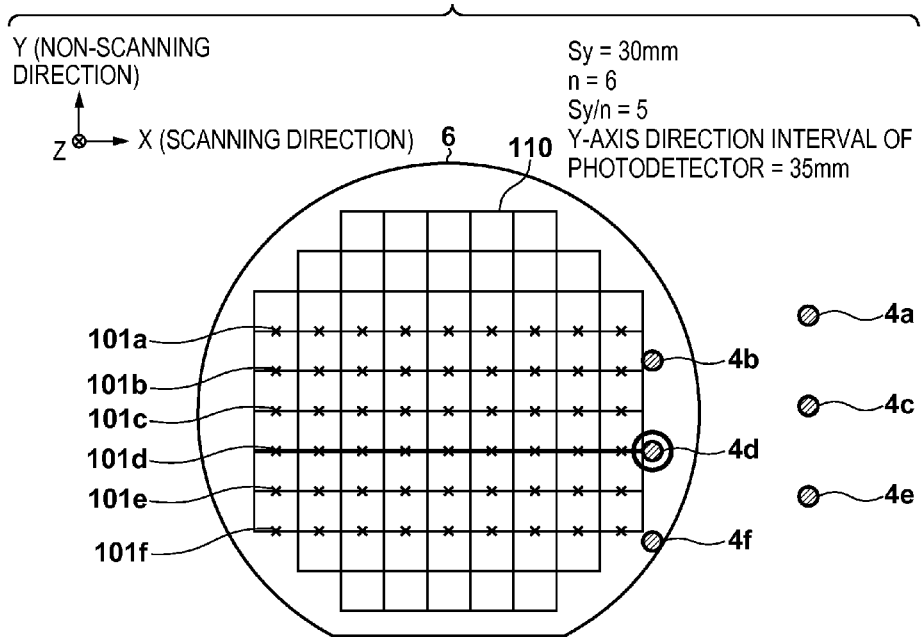
FIG. 5D is a view for explaining the drawing process of the drawing apparatus shown in FIG. 1.
Figure 5E:
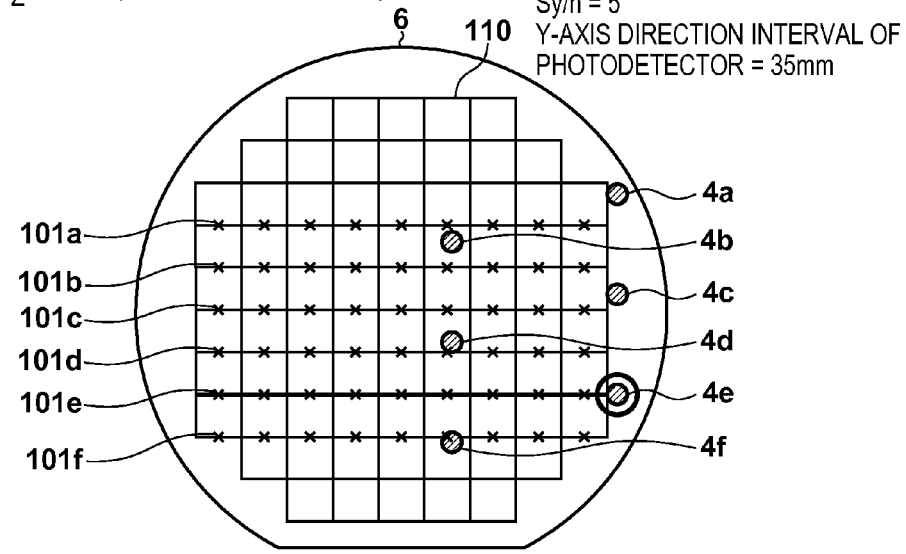
FIG. 5E is a view for explaining the drawing process of the drawing apparatus shown in FIG. 1.
Figure 5F:
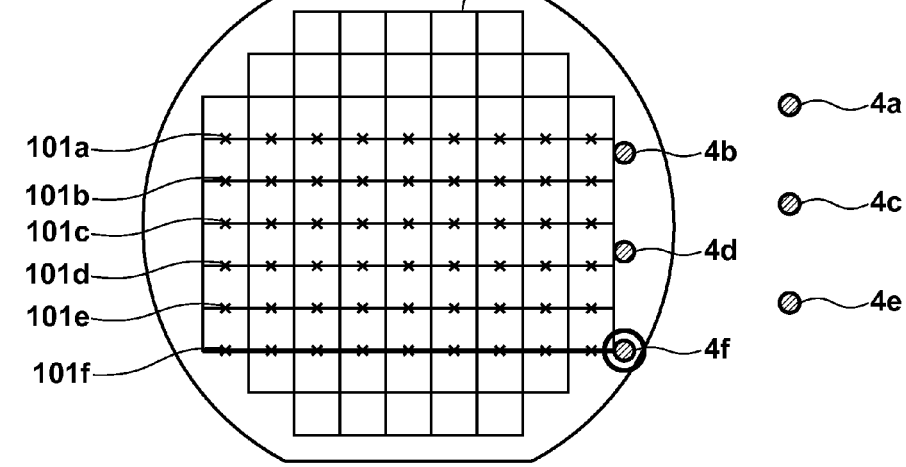
FIG. 5F is a view for explaining the drawing process of the drawing apparatus shown in FIG. 1.

Steps S103 to S109 are repeated until the drawing of the pattern on the substrate 6 is completed. At this time, as shown in FIGS. 5B to 5F, any of the photodetectors 4*a* to 4*f* can detect any of the marks 101*a* to 101*f* in this embodiment. FIG. 5B shows a state in which the step operation has been performed once from the state shown in FIG. 5A, that is, a state in which the stage 2 (substrate 6) has been moved stepwise by 5 mm (=Sy/n) in the Y-axis direction. In FIG. 5B, since the photodetector 4*b*, out of the photodetectors 4*a* to 4*f*, can detect the mark 101*b*, the photodetector 4*b* detects the mark 101*b*. FIG. 5C shows a state in which the step operation has been performed twice from the state shown in FIG. 5A, that is, a state in which the stage 2 (substrate 6) has been moved stepwise by 10 mm in the Y-axis direction. In FIG. 5C, since the photodetector 4*c*, out of the photodetectors 4*a* to 4*f*, can detect the mark 101*c*, the photodetector 4*c* detects the mark 101*c*. FIG. 5D shows a state in which the step operation has been performed thrice from the state shown in FIG. 5A, that is, a state in which the stage 2 (substrate 6) has been moved stepwise by 15 mm in the Y-axis direction. In FIG. 5D, since the photodetector 4*d*, out of the photodetectors 4*a* to 4*f*, can detect the mark 101*d*, the photodetector 4*d* detects the mark 101*d*. FIG. 5E shows a state in which the step operation has been performed four times from the state shown in FIG. 5A, that is, a state in which the stage 2 (substrate 6) has been moved stepwise by 20 mm in the Y-axis direction. In FIG. 5E, since the photodetector 4*e*, out of the photodetectors 4*a* to 4*f*, can detect the mark 101*e*, the photodetector 4*e* detects the mark 101*e*. FIG. 5F shows a state in which the step operation has been performed five times from the state shown in FIG. 5A, that is, a state in which the stage 2 (substrate 6) has been moved stepwise by 25 mm in the Y-axis direction. In FIG. 5F, since the photodetector 4*f*, out of the photodetectors 4*a* to 4*f*, can detect the mark 101*f*, the photodetector 4*f* detects the mark 101*f*.

In the drawing process according to this embodiment, even if the substrate 6 is distorted due to heat generated during the drawing of the pattern on the substrate 6, the irradiation position of the electron beam can be corrected in accordance with the distortion of the substrate 6, and thus overlay precision decrease can be suppressed. In particular, as described above, by arranging the plurality of photodetectors 4 so as to satisfy the equation (1), mark detection by the photodetectors 4 can be performed substantially at equal time intervals, that is, per every step movement by a predetermined distance in the Y-axis direction, thereby contributing to the improvement of overlay precision.

According to the drawing apparatus 100 of this embodiment, even if the substrate 6 is distorted after undergoing normal alignment, the irradiation position of each electron beam can be corrected to eliminate the distortion of the substrate 6 by detecting the marks for obtaining the distortion of the substrate 6 in parallel with the drawing of the pattern. The drawing apparatus 100, therefore, can obtain a high positional accuracy regarding the irradiation on the substrate 6 with each electron beam and suppress a decrease in overlay precision.

Additionally, in FIGS. 5A to 5F, the photodetectors 4a to 4f are arranged at equal intervals in the Y-axis direction to sequentially detect the marks 101a to 101f, respectively, per every positive integer times of step movement of the stage 2 (substrate 6). The photodetectors 4a to 4f also are alternately arranged at two different positions with respect to the X-axis direction. However, the arrangement of the photodetectors 4a to 4f is not limited to the arrangements shown in FIGS. 5A to 5F. For example, the photodetectors 4a to 4f can be arranged so that the detection of the marks is performed substantially at equal time intervals and to detect the respective marks arranged on the respective scribe lines of shot regions that are somewhat apart in the shot layout.

The photodetectors 4a to 4f are not arranged at equal intervals in the Y-axis direction in FIGS. 6A to 6F. Using the photodetector 4a as a reference, the photodetector 4b is arranged in the Y-axis direction so that its distance from the photodetector 4a is 40 mm (that is, so that the Y-axis direction interval between the photodetector 4a and the photodetector 4b is 40 mm). Using the photodetector 4a as a reference, the photodetector 4c is arranged in the Y-axis direction so that its distance from the photodetector 4a is 80 mm (that is, so that the Y-axis direction interval between the photodetector 4b and photodetector 4c is 40 mm). Using the photodetector 4a as a reference, the photodetector 4d is arranged so that its distance from the photodetector 4a is 95 mm (that is, so that the Y-axis direction interval between the photodetector 4c and the photodetector 4d is 15 mm). Using the photodetector 4a as a reference, the photodetector 4e is arranged in the Y-axis direction so that its distance from the photodetector 4a is 105 mm (that is, so that the Y-axis direction interval between the photodetector 4d and the photodetector 4e is 10 mm). Using the photodetector 4a as a reference, the photodetector 4f is arranged in the Y-axis direction so that its distance from the photodetector 4a is 145 mm (that is, so that the Y-axis direction interval between the photodetector 4e and the photodetector 4f is 40 mm).

Figure 6A:
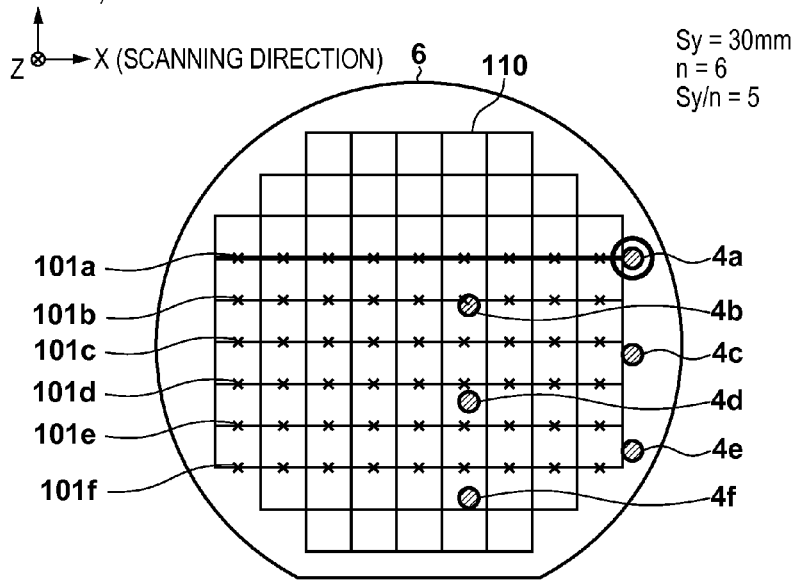
FIG. 6A is a view for explaining the drawing process of the drawing apparatus shown in FIG. 1.
Figure 6B:
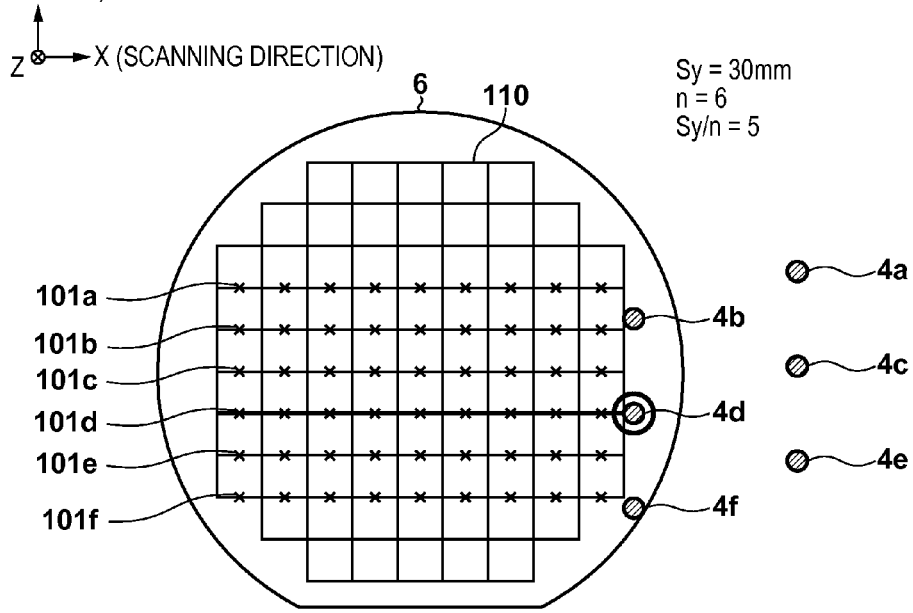
FIG. 6B is a view for explaining the drawing process of the drawing apparatus shown in FIG. 1.
Figure 6C:
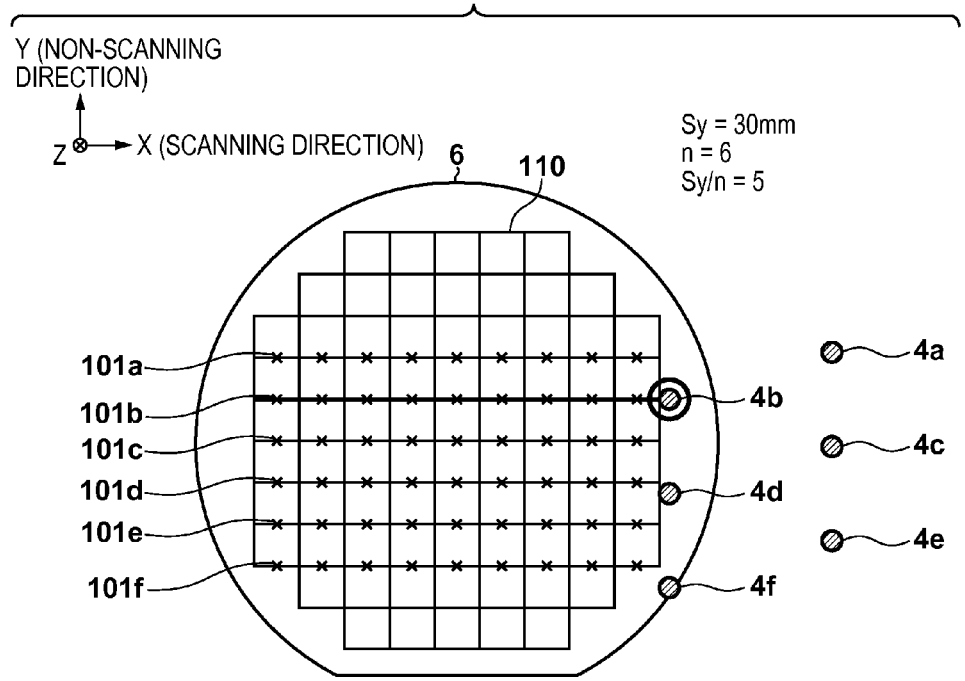
FIG. 6C is a view for explaining the drawing process of the drawing apparatus shown in FIG. 1.
Figure 6D:
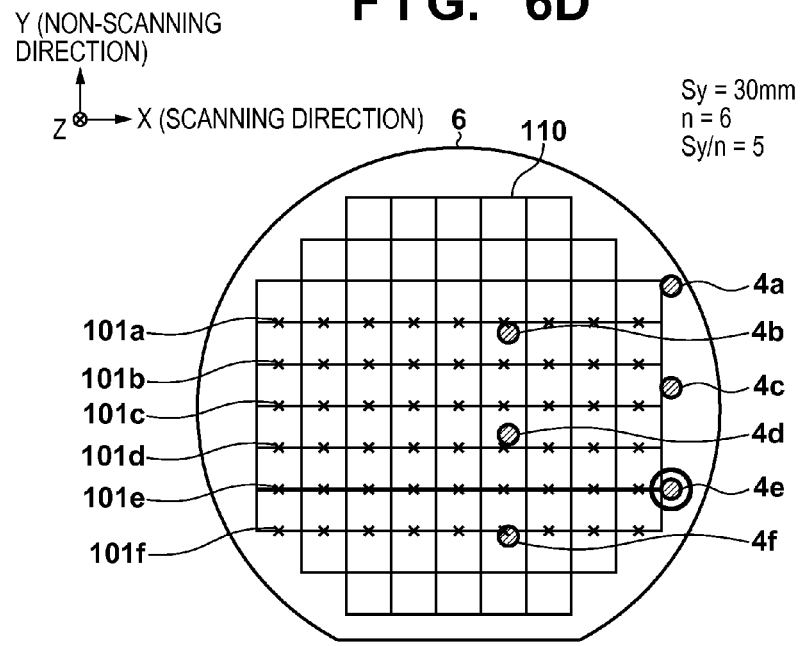
FIG. 6D is a view for explaining the drawing process of the drawing apparatus shown in FIG. 1.
Figure 6E:
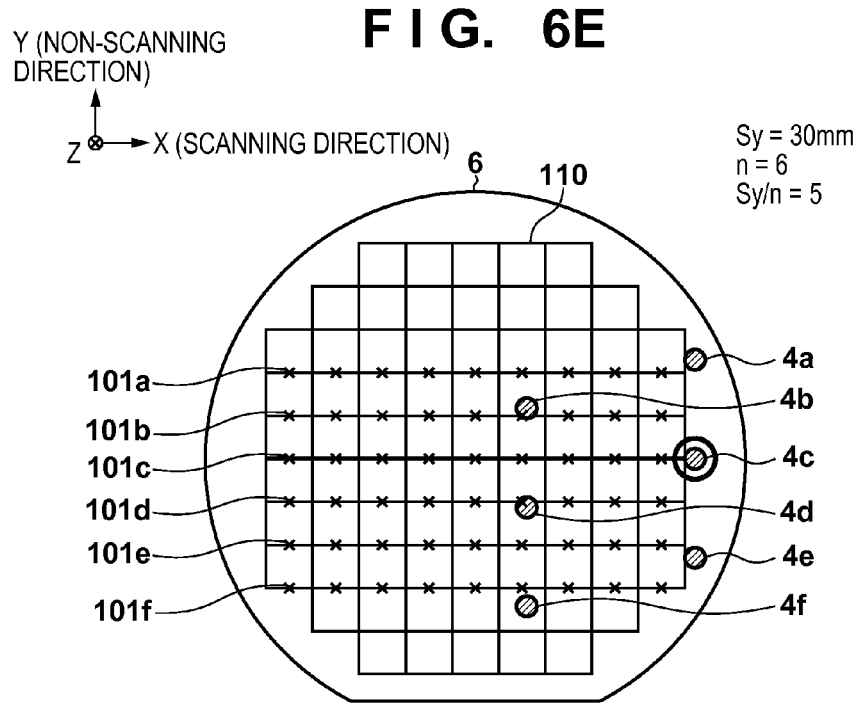
FIG. 6E is a view for explaining the drawing process of the drawing apparatus shown in FIG. 1.
Figure 6F:
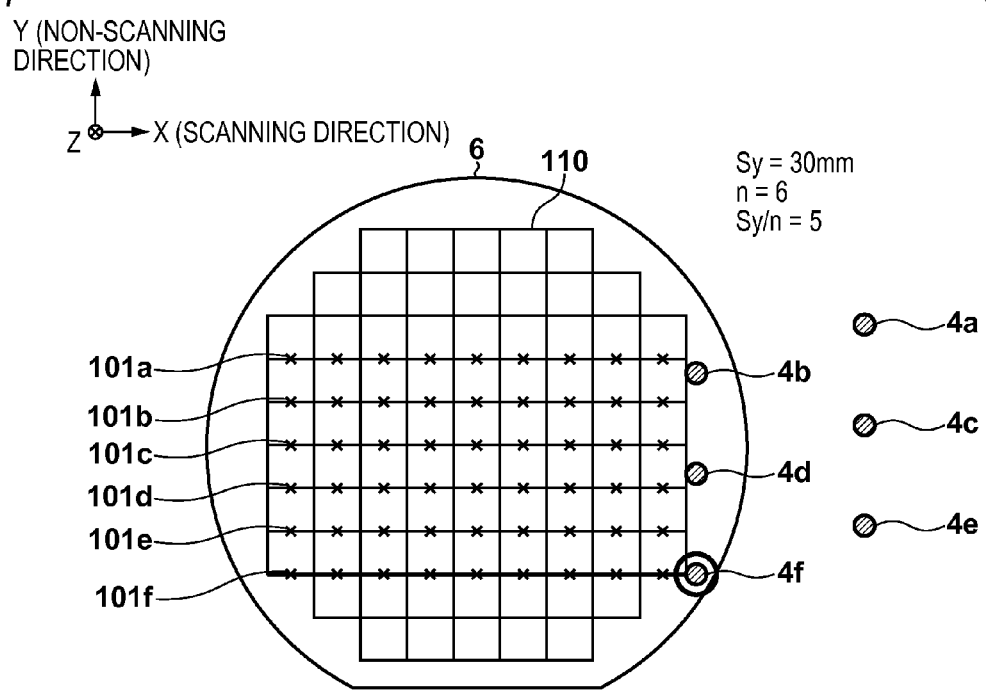
FIG. 6F is a view for explaining the drawing process of the drawing apparatus shown in FIG. 1.

As described above, if steps S103 to S109 are to be repeated until the drawing of the pattern on the substrate 6 is completed, any of the photodetectors 4a to 4f can detect any of the marks 101a to 101f as shown in FIGS. 6A to 6F. For example, in FIG. 6A, since the photodetector 4a, out of the photodetectors 4a to 4f, can detect the mark 101a, the photodetector 4a detects the mark 101a. FIG. 6B shows a state in which the step operation has been performed once from the state shown in FIG. 6A, that is, a state in which the stage 2 (substrate 6) has moved stepwise by 5 mm (=Sy/n) in the Y-axis direction. In FIG. 6B, since the photodetector 4d, out of the photodetectors 4a to 4f, can detect the mark 101d, the photodetector 4d detects the mark 101d. The mark 101d is arranged on a scribe line that is three shot regions away in the Y-axis direction from the mark 101a. FIG. 6C shows a state in which the step operation has been performed twice from the state shown in FIG. 6A, that is, a state in which the stage 2 (substrate 6) has been moved stepwise by 10 mm in the Y-axis direction. In FIG. 6C, since the photodetector 4b, out of the photodetectors 4a to 4f, can detect the mark 101b, the photodetector 4b detects the mark 101b. FIG. 6D shows a state in which the step operation has been performed thrice from the state shown in FIG. 6A, that is, a state in which the stage 2 (substrate 6) has been moved stepwise by 15 mm in the Y-axis direction. In FIG. 6D, since the photodetector 4e, out of the photodetectors 4a to 4f, can detect the mark 101e, the photodetector 4e detects the mark 101e. FIG. 6E shows a state in which the step operation has been performed four times from the state shown in FIG. 6A, that is, a state in which the stage 2 (substrate 6) has been moved stepwise by 20 mm in the Y-axis direction. In FIG. 6E, since the photodetector 4c, out of the photodetectors 4a to 4f, can detect the mark 101c, the photodetector 4c detects the mark 101c. FIG. 6F shows a state in which the step operation has been performed five times from the state shown in FIG. 6A, that is, a state in which the stage 2 (substrate 6) has been moved stepwise by 25 mm in the Y-axis direction. In FIG. 6F, since the photodetector 4f, out of the photodetectors 4a to 4f, can detect the mark 101f, the photodetector 4f detects the mark 101f.

In the arrangements of the photodetectors 4a to 4f as shown in FIGS. 6A to 6F, magnification component of the substrate 6 regarding the Y-axis direction as a non-scanning direction can be obtained by detecting marks arranged in two different scribe lines. In this case, however, it becomes necessary to have a restrictive condition in which the magnification component of the substrate 6 will not largely change during the detection of marks arranged on two different scribe lines.

Figure 7:
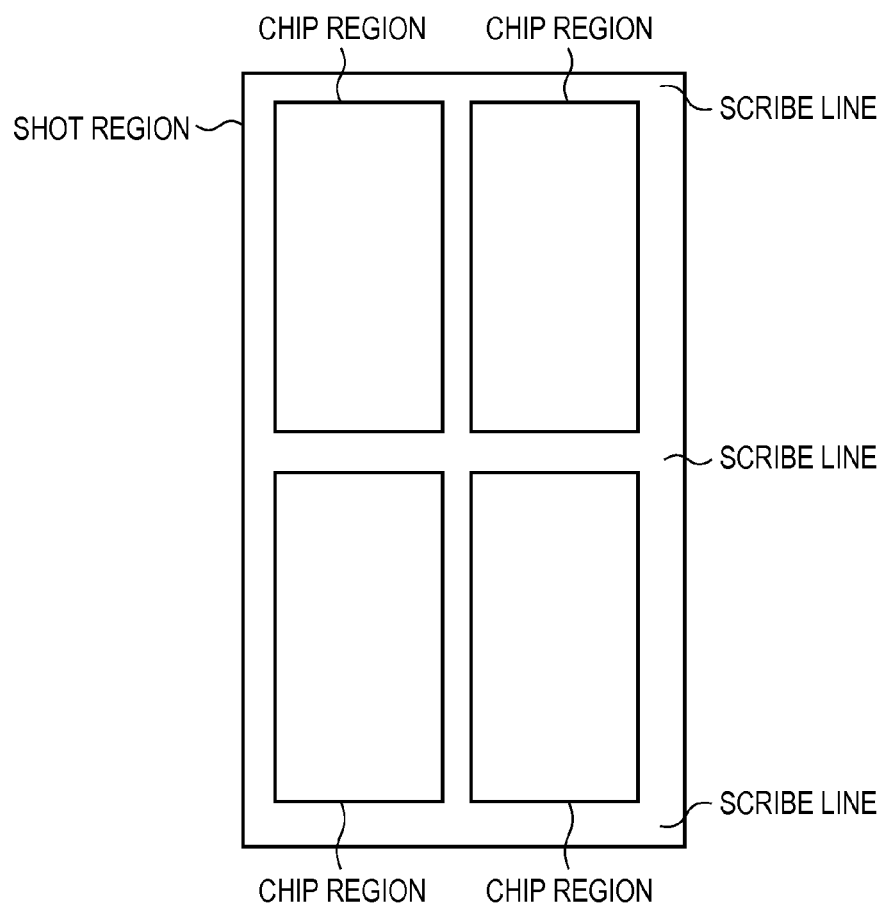
FIG. 7 is a schematic view showing a shot region in which four chip regions are formed.

Furthermore, the marks 101a to 101f are arranged on the upper and lower scribe lines of one shot region. In practice, however, as shown in FIG. 7, four chip regions are formed on one shot region (so-called "one-shot four-chips") in some cases. In such a case, the marks 101a to 101f can be arranged on the scribe lines formed in between the chip regions. Then, the photodetectors 4a to 4f can be arranged so as to satisfy the equation (1) by replacing the shot region size Sy in the Y-axis direction with the chip region size (width) in the Y-axis direction.

The drawing apparatus 100 is suitable for manufacturing an article, for example, a microdevice such as a semiconductor device or an element having a microstructure. The method of manufacturing an article includes a step of forming a latent image pattern on a photosensitive agent applied on a substrate by using the drawing apparatus 100 (a step of performing patterning on a substrate), and a step of developing the substrate on which the latent image pattern is formed in the above step (a step of developing the substrate on which patterning has been performed). This manufacturing method further includes other well-known steps (for example, oxidation, film formation, deposition, doping, planarization, etching, resist removal, dicing, bonding, and packaging). When compared to the conventional methods, the method of manufacturing an article according to this embodiment is advantageous in at least one of the performance, quality, productivity, and production cost of an article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-234002 filed on Nov. 18, 2014, which is hereby incorporated by reference herein in its entirety.

What is claimed is:

1. A lithography apparatus that performs patterning on a substrate with a beam, the apparatus comprising:
   an optical system configured to irradiate the substrate with the beam;
   a plurality of detectors each configured to detect a mark on the substrate; and a controller configured to control the patterning so that a first operation and a second operation are alternately performed, the first operation irradiating the substrate with the beam by the optical system while scan movement of the substrate is performed in a first direction, the second operation performing step movement of the substrate in a second direction different from the first direction;

wherein the controller is configured to cause, in the first operation, at least one of the plurality of detectors to detect the mark, and the plurality of detectors are arranged, in the second direction, at an interval which is a positive integer multiple of a distance of the step movement.

2. The apparatus according to claim 1, wherein the plurality of detectors are arranged at even intervals in the second direction.

3. The apparatus according to claim 1, wherein the plurality of detectors are arranged so as to sequentially detect the mark with respect to every positive integer times of the step movement.

4. The apparatus according to claim 1, wherein the plurality of detectors are alternately arranged at two positions different from each other with respect to the first direction.

5. The apparatus according to claim 1, wherein each of the plurality of detectors has a field of view by the distance in the second direction and are configured to detect the mark with at least half of the mark falling within the field of view.

6. The apparatus according to claim 1, further comprising: a driving device configured to change the interval.

7. The apparatus according to claim 1, wherein the controller is configured to obtain a distortion amount of the substrate based on an output from at least one of the plurality of detectors.

8. The apparatus according to claim 7, wherein the distortion amount of the substrate includes a component regarding a magnification of the substrate.

9. The apparatus according to claim 1, wherein the mark is formed in a scribe region on the substrate.

10. The apparatus according to claim 1, wherein the optical system is configured to irradiate the substrate with, as the beam, a charged particle beam.

11. A lithography apparatus that performs patterning on a substrate with a beam, the apparatus comprising:
an optical system configured to irradiate the substrate with the beam;
a plurality of detectors each configured to detect a mark on the substrate; and
a controller configured to control the patterning so that a first operation and a second operation are alternately performed, the first operation irradiating the substrate with the beam by the optical system while scan movement of the substrate is performed in a first direction, the second operation performing step movement of the substrate in a second direction different from the first direction;
wherein the controller is configured to cause, in the first operation, at least one of the plurality of detectors to detect the mark, and
the plurality of detectors are arranged at an interval in the second direction so as to detect the mark by one of the plurality of detectors with respect to every positive integer times of the step movement.

12. The apparatus according to claim 11, wherein the mark is formed in a scribe region on the substrate.

13. The apparatus according to claim 11, wherein the optical system is configured to irradiate the substrate with, as the beam, a charged particle beam.

14. A method of manufacturing an article, the method comprising:
performing patterning on a substrate using a lithography apparatus; and
developing the substrate, on which the patterning has been performed, to manufacture the article,
wherein the lithography apparatus performs the patterning on the substrate with a beam and includes:
an optical system configured to irradiate the substrate with the beam;
a plurality of detectors each configured to detect a mark on the substrate; and
a controller configured to control the patterning so that a first operation and a second operation are alternately performed, the first operation irradiating the substrate with the beam by the optical system while scan movement of the substrate is performed in a first direction, the second operation performing step movement of the substrate in a second direction different from the first direction;
wherein the controller is configured to cause, in the first operation, at least one of the plurality of detectors to detect the mark, and
the plurality of detectors are arranged, in the second direction, at an interval which is a positive integer multiple of a distance of the step movement.

15. A method of manufacturing an article, the method comprising:
performing patterning on a substrate using a lithography apparatus; and
developing the substrate, on which the patterning has been performed, to manufacture the article,
wherein the lithography apparatus performs the patterning on the substrate with a beam and includes:
an optical system configured to irradiate the substrate with the beam;
a plurality of detectors each configured to detect a mark on the substrate; and
a controller configured to control the patterning so that a first operation and a second operation are alternately performed, the first operation irradiating the substrate with the beam by the optical system while scan movement of the substrate is performed in a first direction, the second operation performing step movement of the substrate in a second direction different from the first direction;
wherein the controller is configured to cause, in the first operation, at least one of the plurality of detectors to detect the mark, and
the plurality of detectors are arranged at an interval in the second direction so as to detect the mark by one of the plurality of detectors with respect to every positive integer times of the step movement.

* * * * *